United States Patent
Cho et al.

(10) Patent No.: US 8,291,278 B2
(45) Date of Patent: Oct. 16, 2012

(54) METHOD AND APPARATUS FOR COMBINING HYBRID AUTOMATIC REPEAT REQUEST DATA IN WIRELESS COMMUNICATION SYSTEM

(75) Inventors: Hyun-Sang Cho, Yongin-si (KR); Byung-Tae Kang, Seoul (KR); Jin-Woo Roh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 637 days.

(21) Appl. No.: 12/459,752

(22) Filed: Jul. 7, 2009

(65) Prior Publication Data
US 2010/0005356 A1    Jan. 7, 2010

(30) Foreign Application Priority Data
Jul. 7, 2008   (KR) ................. 10-2008-0065265

(51) Int. Cl.
*H03M 13/00*   (2006.01)
(52) U.S. Cl. ................. 714/751; 714/796
(58) Field of Classification Search ............ 714/748, 714/751, 796; 375/262, 341
See application file for complete search history.

(56) References Cited

U.S. PATENT DOCUMENTS

| | | | |
|---|---|---|---|
| 6,654,926 B1 * | 11/2003 | Raphaeli et al. | 714/780 |
| 7,685,493 B2 * | 3/2010 | Widdup et al. | 714/751 |
| 7,965,793 B2 * | 6/2011 | Golitschek Edler Von Elbwart et al. | 375/308 |
| 8,059,759 B2 * | 11/2011 | Park et al. | 375/340 |

* cited by examiner

*Primary Examiner* — Esaw Abraham (57) ABSTRACT

A receiving method and apparatus for combining Hybrid Automatic Repeat Request (HARQ) data in a wireless communication system are provided. More particularly, a method and apparatus for increasing HARQ combining capability while effectively using a limited-sized memory are provided. The receiving method for combining the HARQ data includes predicting a maximum size of currently receivable data, converting HARQ data received from a transmitting end into Log Likelihood Ratio (LLR) information, determining whether the received HARQ data is retransmitted data, if the determination result shows that the HARQ data is not the retransmitted data, determining whether the converted LLR information is compressed according to the predicted maximum data size, and storing the converted LLR information in a memory according to the determination result on whether compression is necessary.

20 Claims, 7 Drawing Sheets

METHOD AND APPARATUS FOR COMBINING HYBRID AUTOMATIC REPEAT REQUEST DATA IN WIRELESS COMMUNICATION SYSTEM

CROSS-REFERENCE TO RELATED APPLICATION(S) AND CLAIM OF PRIORITY

The present application claims the benefit under 35 U.S.C. §119(a) of a Korean patent application filed in the Korean Intellectual Property Office on Jul. 7, 2008 and assigned Serial No. 10-2008-0065265, the entire disclosure of which is hereby incorporated by reference.

TECHNICAL FIELD OF THE INVENTION

The present invention relates to a method and apparatus for combining Hybrid Automatic Repeat reQuest (HARQ) data in a wireless communication system. More particularly, the present invention relates to a method and apparatus for effectively using a memory while improving data combining capability.

BACKGROUND OF THE INVENTION

Mobile communication services have recently provided various services such as broadcasting, multimedia videos, e-mails, multimedia messages, and the like, to examine a possibility of opening a new market. The advent of the information era requests wireless multimedia services with a variety of qualities, for example, from a slow speed to a high speed and from a real time to a non-real time.

Accordingly, new research is conducted so that a mobile communication system can use techniques for effectively allocating a resource (i.e., a frequency channel), that is, a limited frequency band between users. In association with this research, a wireless communication system proposes wireless transmission techniques, for example, wireless multiple access and multiplexing, high-speed packet wireless transmission, wireless link control, and the like.

In particular, a Hybrid Automatic Repeat Request (HARQ) scheme related to a wireless link control scheme controls errors by combining Automatic Repeat Request (ARQ) and Forward Error Correction (FEC), thereby improving data transmission reliability. As a result, the HARQ scheme can apply to a packet data service of which a packet is generated in a burst manner similarly to a wireless Internet packet.

When using the HARQ scheme, a receiving end determines whether a response is either affirmative (hereinafter, acknowledgment (ACK)) or negative (hereinafter, Negative-ACK (NACK)) according to a result obtained by performing decoding on transmitted data, and transmits the determination result to a transmitting end so as to request the transmitting end to retransmit the same data. In this mechanism, if the receiving end determines a NACK response according to the decoding result, the transmitting end retransmits corresponding data. Accordingly, the receiving end combines retransmitted data with previous data, thereby improving reception capability. In this case, the receiving end determines whether data transmitted for an HARQ operation is newly transmitted data or retransmitted data, and stores the transmitted data to improve data combining capability. Therefore, for a proper HARQ operation, transmitted HARQ data needs to be controlled, and a memory for storing the HARQ data needs to be effectively controlled and managed.

The 802.16 standard and the Mobile WiMax standard are wireless standards related to the HARQ scheme. In these standards, a transmitting end allocates HARQ data and a receiving end transmits an ACK/NACK response (i.e., ACK_RSP) for the HARQ data according to an ARQ Channel Identifier (ACID). The ACID is identification information for identifying HARQ data. An ACK channel corresponds to a region allocated to transmit ACK/NACK information by the receiving end to the transmitting end as a result of error detection performed on the HARQ data. In addition, new transmission/retransmission for a downlink HARQ burst is determined according to indication information of an allocation message of the HARQ data. For example, new transmission/retransmission can be determined according to a toggle state (i.e., '0' or '1') of AI_SN field information of an 'HARQ DL-MAP message'. That is, when allocating an HARQ burst for a corresponding ACID, if AI_SN information is identical to AI_SN information for current HARQ burst allocation, it implies retransmission, and otherwise, it implies new transmission.

When using the HARQ scheme, previous data and newly received retransmission data have to be combined with each other, and thus data storing is a necessary process. A data storage space has been increasing as a higher speed is demanded by communication systems. A memory size required to store HARQ data is determined according to the number of bits of Log Likelihood Ratio (LLR) information. The greater the number of bits of the LLR information stored in a memory, the higher the data combining capability and the decoding capability. However, a memory size increases to the extent of the increased number of bits. Therefore, an effective structure of a communication system depends on a combining method of an HARQ combiner and a determination result on the number of bits of the LLR information. Accordingly, there is a need for an HARQ combining method capable of effectively using and managing a limited-sized memory while improving capability when using an HARQ scheme.

SUMMARY OF THE INVENTION

To address the above-discussed deficiencies of the prior art, it is a primary aspect of the present invention to solve at least the above-mentioned problems and/or disadvantages and to provide at least the advantages described below. Accordingly, an aspect of the present invention is to provide a method and apparatus for increasing HARQ combining capability while effectively using a limited-sized memory in a communication system.

Another aspect of the present invention is to provide an apparatus and method capable of effectively using a memory by storing the number of bits of LLR information of HARQ data with or without compression when storing the LLR information in a communication system.

Another aspect of the present invention is to provide an apparatus and method capable of effectively using a memory by directly reading LLR information of HARQ data according to the number of bits of previously stored LLR information or by reading the LLR information with decompression when combining the LLR information in a communication system.

In accordance with an aspect of the present invention, a receiving apparatus for combining HARQ data in a communication system is provided. The receiving apparatus includes an LLR demapper operable to convert HARQ data received from a transmitting end into LLR information, an HARQ combiner operable to at least one of allow the LLR information of the received HARQ data to be stored, and to combine corresponding LLR information stored in an HARQ data memory with the LLR information of the received HARQ data, an HARQ LLR information bit size controller operable to determine whether LLR information needs to be compressed according to a predicted maximum data size if the received HARQ data is not retransmitted data, and to store the LLR information converted according to the determination result on whether compression is necessary, and the HARQ data memory operable to store the converted LLR information according to the determination result on whether compression is necessary.

In accordance with another aspect of the present invention, a receiving method for combining HARQ data in a communication system is provided. The receiving method includes predicting a maximum size of currently receivable data, converting HARQ data received from a transmitting end into LLR information, determining whether the received HARQ data is retransmitted data, and storing the converted LLR information in a memory according to the determination result on whether compression is necessary.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

Hereinafter, a wireless communication system using a HARQ scheme for packet-based data will be described. The present invention can also equally apply to any system using the HARQ scheme for signal exchange.

The present invention described below relates to a method of combining HARQ data in a wireless communication system. HARQ combining is performed on retransmitted data and previously received data by using an HARQ data memory capable of storing the previously received data. In a proposed structure, capability as close as possible to optimal capability can be obtained while reducing a size of the HARQ data memory. A maximum data size to be stored in the HARQ data memory is predicted by considering a channel environment, information on an average data size, or a data size required for a service. The predicted maximum data size is compared with an available space size of the HARQ data memory. If the predicted HARQ data size is less than the available memory space size, data is stored according to an original number of bits of pre-designed LLR information of received data. If the predicted HARQ data size is greater than the available memory space size, data can be stored by decreasing the original number of bits of the designed LLR information of the received data, i.e., by compressing the LLR information. Retransmitted HARQ data is combined using the stored information.

According to an embodiment, if there is an available empty memory space, the HARQ data is stored according to the original number of bits of the LLR information, and LLR information of which the number of bits is compressed can also be stored together with the HARQ data. In this case, if the HARQ data is stored according to the original number of bits of the LLR information when data is retransmitted/re-received, the LLR information can be read and combined. Further, if the HARQ data stored according to the original number of bits of the LLR and the HARQ data of which the number of bits is compressed to be less than the original number of bits of the LLR are stored separately, HARQ data having another Automatic Repeat Request (ARQ) Channel Identifier (ID) (i.e., ACID) may be received before pre-stored data is retransmitted or re-received, resulting in insufficient available HARQ memory space. In this case, the HARQ data having another ACID is over-written in an area for LLR information stored according to the original number of bits of the LLR. The HARQ data of the stored compressed LLR information may be used for recombination.

Figure 5:
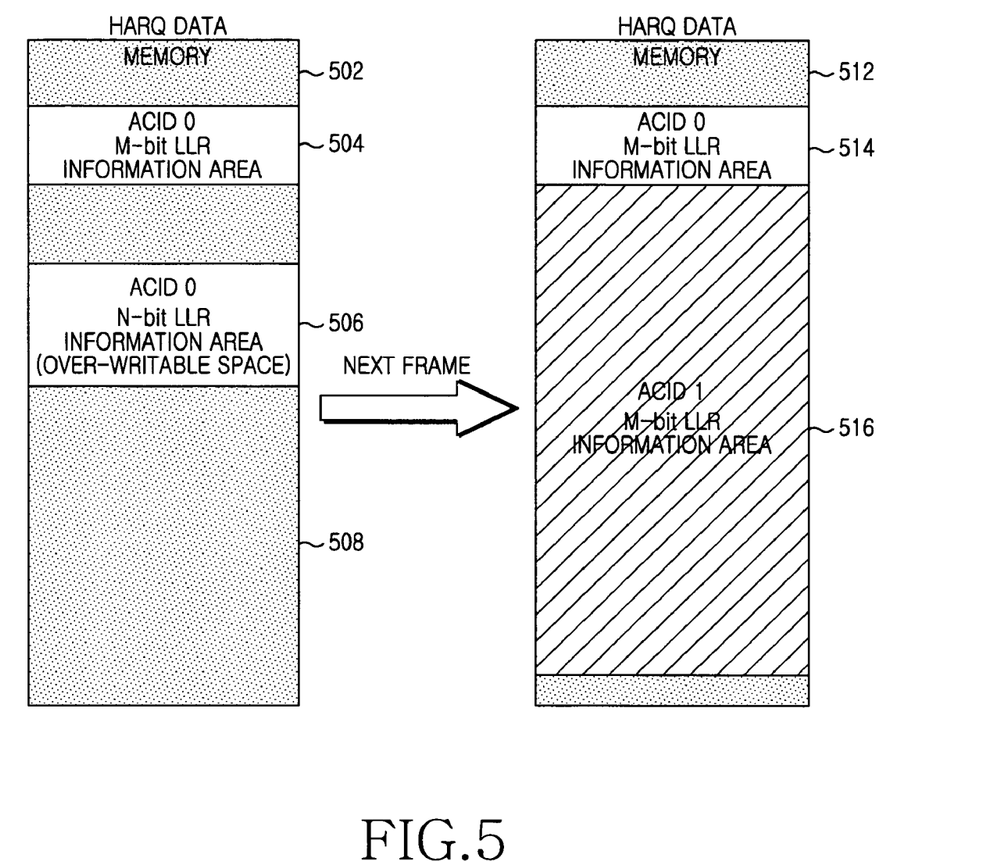
FIG. 5 illustrates diagram of an HARQ data storage area of an HARQ data memory depending on different frame times according to an exemplary embodiment of the present invention.

FIG. 5 illustrates diagram of an HARQ data storage area of an HARQ data memory depending on different frame times according to an exemplary embodiment of the present invention. As described above, an HARQ data memory 502 of FIG. 5 stores an N-bit LLR information area 506 depending on an original number of bits of an LLR of HARQ data having an ACID '0' and an M-bit LLR information area 504 of which the number of bits is less than the original number of bits of the HARQ data having the ACID '0'. When HARQ data having another ACID (i.e., ACID '1') is received in a next frame, if there is no available memory space, the LLR information area 506 of the HARQ data having the ACID '0' can be deallocated to store the LLR information of the HARQ data having the ACID '1', as indicated by the reference numeral 516 in FIG. 5.

Figure 1:
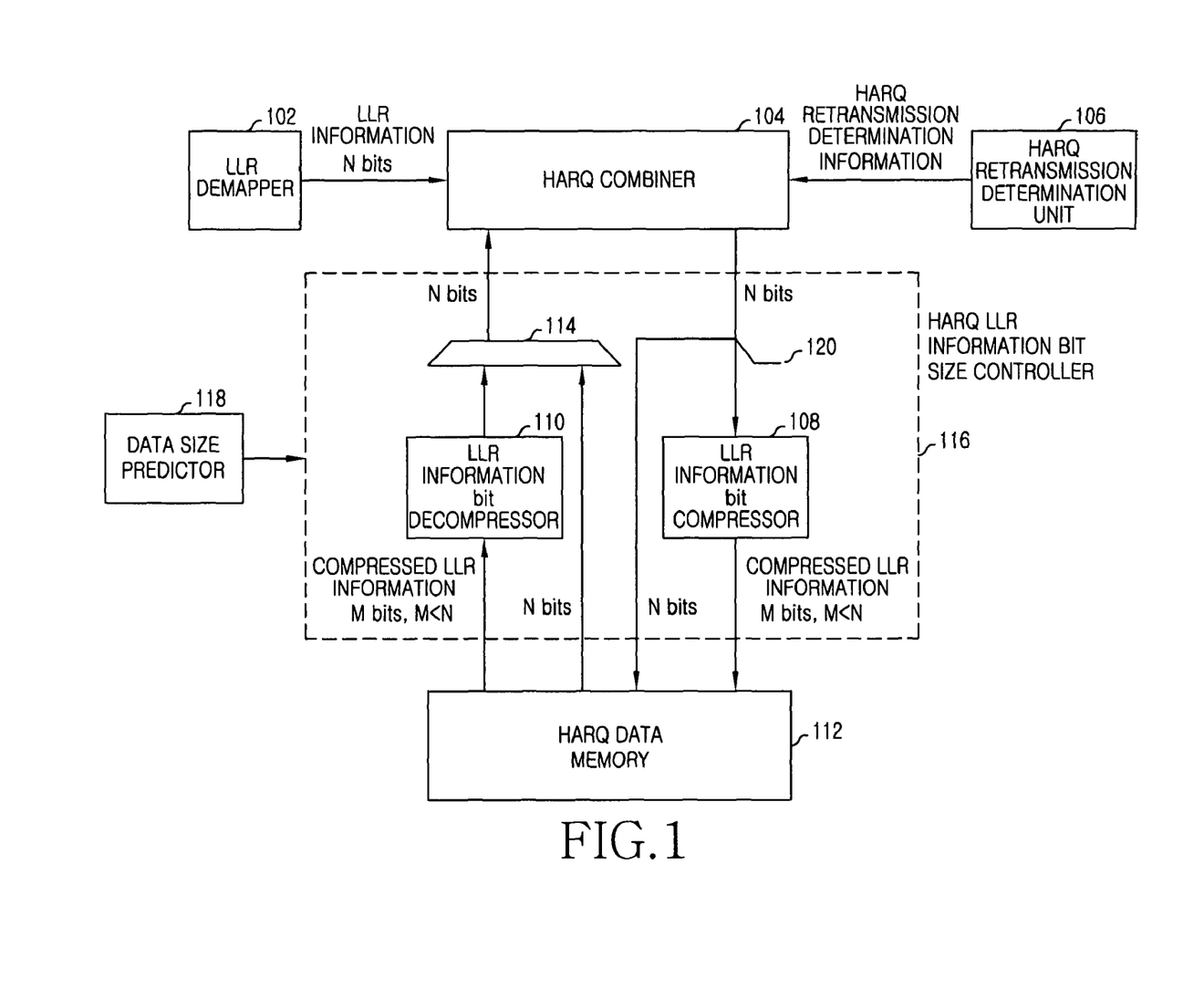
FIG. 1 illustrates a block diagram of an apparatus for combining Hybrid Automatic Repeat reQuest (HARQ) data according to an exemplary embodiment of the present invention.

FIG. 1 illustrates a block diagram of an apparatus for combining HARQ data according to an exemplary embodiment of the present invention. The apparatus for combining the HARQ data includes an LLR demapper 102, an HARQ combiner 104, an HARQ retransmission determination unit 106, an HARQ data memory 112, an HARQ LLR information bit size controller 116, a data size predictor 118, and the like. Although not shown, a previous stage of the LLR demapper 102 is provided with not only an antenna for receiving HARQ signals transmitted from a transmitter but also a Radio Frequency (RF) receiver, a demodulator (e.g., an Orthogonal Frequency Division Multiplexing (OFDM) demodulator and a de-spreading demodulator) for demodulating a baseband signal, a channel estimator, and the like.

Referring to FIG. 1, the LLR demapper 102 converts HARQ data symbols into respective LLR values by using a channel estimation result. The LLR value represents a probability required to determine a received data value and is expressed in a bit format. That is, the LLR value is expressed differently according to a probability of being '1' or '0'. The LLR demapper 102 generates LLR values depending on a predetermined length and delivers the generated LLR values to the HARQ combiner 104. It is assumed that N is an original number of bits (i.e., a length) of the LLR values output from the LLR demapper 102. Herein, N denotes the number of bits used when one coded bit is expressed with the LLR value. When the N-bit LLR information is delivered to the HARQ combiner 104, the HARQ retransmission determination unit 106 determines whether the LLR information is retransmitted data. That is, whether the LLR information is the retransmitted data can be determined according to control information indicated in a received HARQ allocation message.

If the LLR information delivered to the HARQ combiner 104 is determined to be HARQ data newly transmitted from a transmitter, the HARQ retransmission determination unit 106 delivers the determination information to the HARQ combiner 104, and the HARQ combiner 104 delivers LLR information of the newly received HARQ data to the HARQ LLR information bit size controller 116.

The data size predictor 118 predicts a maximum receivable data size at a current communication condition, and delivers the predicted maximum receivable data size to the HARQ LLR information bit size controller 116. The data size predictor 118 can determine the maximum receivable data size by using, for example, an average Carrier to Interference and Noise Ratio (CINR) and/or an average data allocation size, a maximum possible data size for a corresponding service, or the like. Since a memory size capable of storing the LLR information is limited and an occupied memory area size is determined by a product between a maximum data size and a length (i.e., the number of bits) of an LLR value, the length of the LLR value that can be stored according to a received data size can be changed. In general, when a transmitting end allocates HARQ data, data is allocated on the basis of a data size required for a service and CINR information of a receiver currently in use. Even in a situation where a data service requires a high speed, if a CINR value measured in a receiving end is low, more amount of data can be allocated. This is because a low CINR results in data transmission with a low modulation rate and thus a data rate is decreased to that extent. Accordingly, the maximum receivable data size varies according to a communication environment and a service type, and as a result, it can be determined whether an LLR bit needs to be compressed.

The HARQ LLR information bit size controller 116 compares the maximum data size received from the data size predictor 118 with an available space size of the HARQ data memory 112. If the available space size of the HARQ data memory 112 is insufficient, the HARQ LLR information bit size controller 116 delivers LLR information from the HARQ combiner 104 to an LLR information bit compressor 108, and compresses each LLR value of the LLR information from N bits to M bits (herein M<N, where M and N are integers greater than or equal to '1'). Then, the HARQ LLR information bit size controller 116 stores the compressed LLR information in the HARQ data memory 112. Otherwise, if the available space size of the HARQ data memory 112 is sufficient, the HARQ LLR information bit size controller 116 directly stores the LLR information in the HARQ data memory 112 without compression. According to another embodiment, if the available space size of the HARQ data memory 112 is sufficiently greater than a predicted HARQ data size, the HARQ combiner 104 can provide the LLR information to the LLR information bit compressor 108 while directly storing the uncompressed LLR information in the HARQ data memory 112. Then, the LLR information bit compressor 108 stores each LLR value of the LLR information in the HARQ data memory 112 after compressing each LLR value from N bits to M bits. That is, if the memory space is sufficient, compressed data and uncompressed data can be stored together in the memory. That is, LLR information can be delivered on two paths without having to select any one of the paths at a branch point 120.

If the HARQ retransmission determination unit 106 determines that the LLR information delivered to the HARQ combiner 104 is retransmitted data, the HARQ retransmission determination unit 106 delivers the determination information to the HARQ combiner 104. Accordingly, the HARQ combiner 104 reads LLR information of previously received HARQ data having the same ACID from the HARQ data memory 112, and combines the read LLR information with LLR information of retransmitted HARQ data. The LLR information of the HARQ data is read from the HARQ data memory 112 under the control of the HARQ LLR information bit size controller 116. That is, if the LLR information of the HARQ data is stored without compression in the HARQ data memory 112, the HARQ LLR information bit size controller 116 controls a selector 114 to select a path not passing an LLR information bit decompressor 110 to deliver the LLR information from the HARQ data memory 112 to the HARQ combiner 104. If the LLR information of the HARQ data is stored with compression in the HARQ data memory 112, the HARQ LLR information bit size controller 116 controls the LLR information bit decompressor 110 to decompress an M-bit LLR value into an N-bit value and then controls the selector 114 to deliver the decompressed LLR information to the HARQ combiner 104. According to another embodiment, if the HARQ data memory 112 stores both compressed data and uncompressed data having the same ACID, the uncompressed data is read under the control of the HARQ LLR information bit size controller 116. In doing so, HARQ data combining capability can be effectively improved by using a limited-sized HARQ data memory.

In the designing of the HARQ data memory, a memory size can be determined according to the maximum receivable data size and the number of bits of the compressed LLR value, as expressed by Equation 1:

$$\text{HARQ\_LLR\_memory\_size} = \text{Max\_LLR\_data\_size} * \text{Compressed\_LLR\_bit\_size} \quad [\text{Eqn. 1}]$$

That is, the HARQ data memory size can be expressed as a product of the maximum data size and the number of bits of the compressed LLR value. Further, an LLR information size stored in the HARQ data memory by receiving actual HARQ data can be expressed by a product of a maximum received data size and a bit size of the LLR value. Therefore, by predicting a maximum received data size according to a limited memory size, it can be determined whether the bit size of the LLR value needs to be compressed or not.

Now, a method of obtaining an HARQ data size predicted by the data size predictor 118 will be described in detail.

When HARQ data is allocated in a transmitting end, a modulation scheme of the HARQ data is determined by a CINR value fed back from a receiving end. For example, when the CINR is high, 64 Quadrature Amplitude Modulation (QAM) may be determined as the data modulation scheme, and when the CINR is low, Quadrature Phase-Shift Keying (QPSK) may be determined as the data modulation scheme. In general, modulation schemes and CINR values in a communication system have a mapping relation expressed in a table format. According to a standard type and required capability, a decodable modulation scheme can be roughly determined according to the CINR value. Therefore, the receiving end may determine an average CINR value to know a data modulation scheme that can be assigned by the transmitting end at a current channel condition. Since a size of received data varies depending on the data modulation scheme, a maximum receivable data size can be predicted at the current communication condition, and a length (i.e., the number of bits) of an LLR value can be adaptively regulated.

Figure 2:
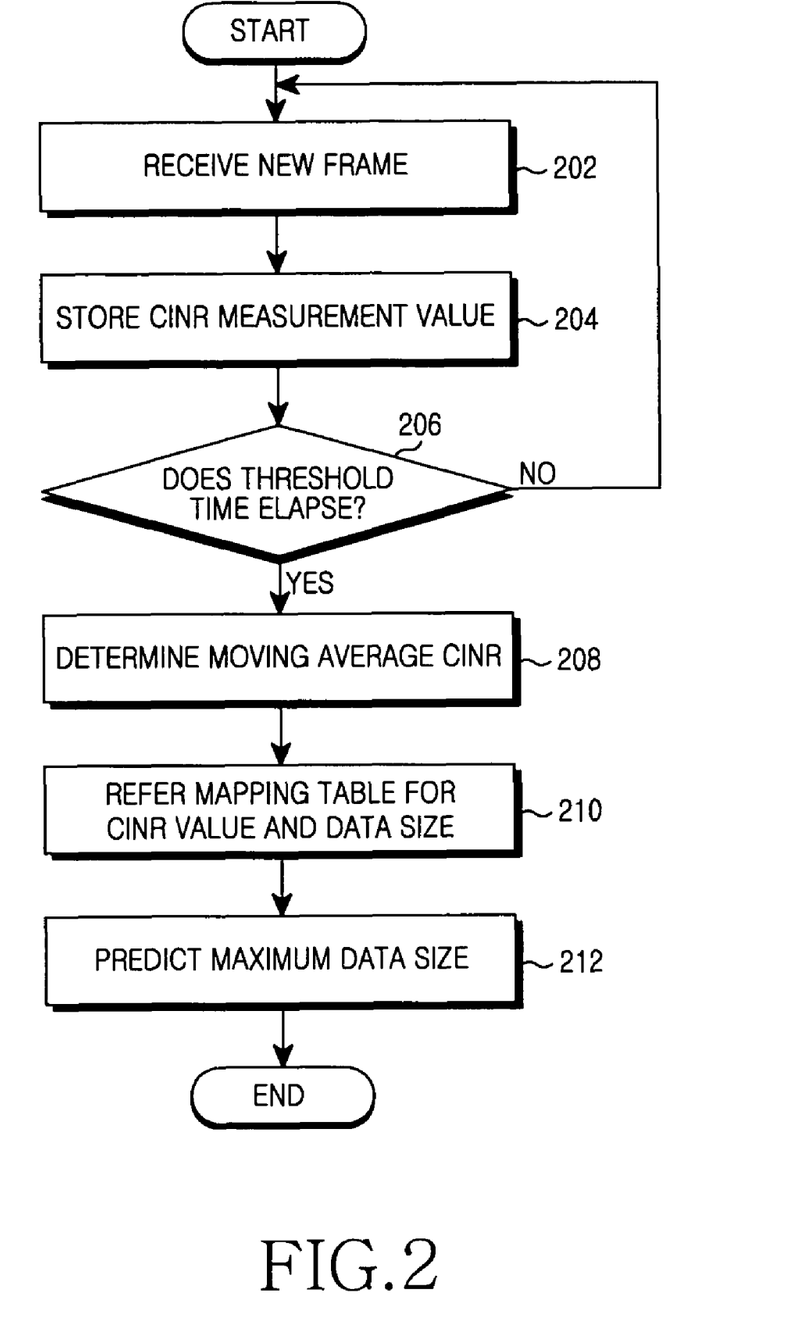
FIG. 2 illustrates a flowchart for a process of predicting a data size by using a moving average Carrier to Interference and Noise Ratio (CINR) according to an exemplary embodiment of the present invention.

FIG. 2 illustrates a flowchart for a process of predicting a data size by using a moving average CINR according to an exemplary embodiment of the present invention.

Referring to FIG. 2, when a new frame is received (step 202), a receiver stores a CINR measurement value (step 204). In general, a Mobile Station (MS) currently performing data communication periodically measures a CINR and reports the measured CINR to a Base Station (BS) through a feedback channel (e.g., Channel Quality Indicator Channel (CQICH)). In the present invention, CINRs measured with a predetermined period are moving-averaged, and the moving-averaged value is used to predict a maximum data size. That is, the receiver determines whether a predetermined threshold time elapses in order to determine a specific observation time duration to determine an average of the CINRs (step 206). If the threshold time does not elapse, the receiver measures the CINR with the predetermined period, and stores each measurement value. If the threshold time elapses, the receiver determines an average CINR by moving-averaging the stored CINR values during the threshold time duration (step 208). That is, the average CINR is determined every specific observation time duration. A length of the duration for obtaining the average CINR can be determined by software. In doing so, it is possible to know information on a modulation scheme of allocatable data depending on a channel condition of a receiver currently in use. The modulation scheme information depending on the CINR value can be configured in a table format, and likewise, a data size depending on the modulation scheme can also be configured in a table format. Therefore, by using the determined moving average CINR value, the receiver refers a predetermined mapping table that shows a relation between the CINR value and the data size (step 210). Further, the receiver predicts a maximum receivable data size (step 212).

According to another embodiment, a maximum HARQ data size can be predicted using an average data allocation size. Data transmitted from a transmitting end may have a size that changes according to various factors. Therefore, a receiving end can predict a maximum data size on the basis of an actual data allocation size during a specific average time duration. That is, even if a communication environment is good, data transmission may be restricted according to a condition of a transmitter. This is a case where an actually allocated data size is small even though a maximum receivable data size is great when considering CINR information in the receiving end. Therefore, in a case of using only the CINR information, LLR data may have to be compressed even when LLR data compression is unnecessary. To compensate for such a shortcoming, sizes of data received for a specific duration may be averaged and the averaged value may be used to determine whether the LLR information needs to be compressed or not.

Figure 3:
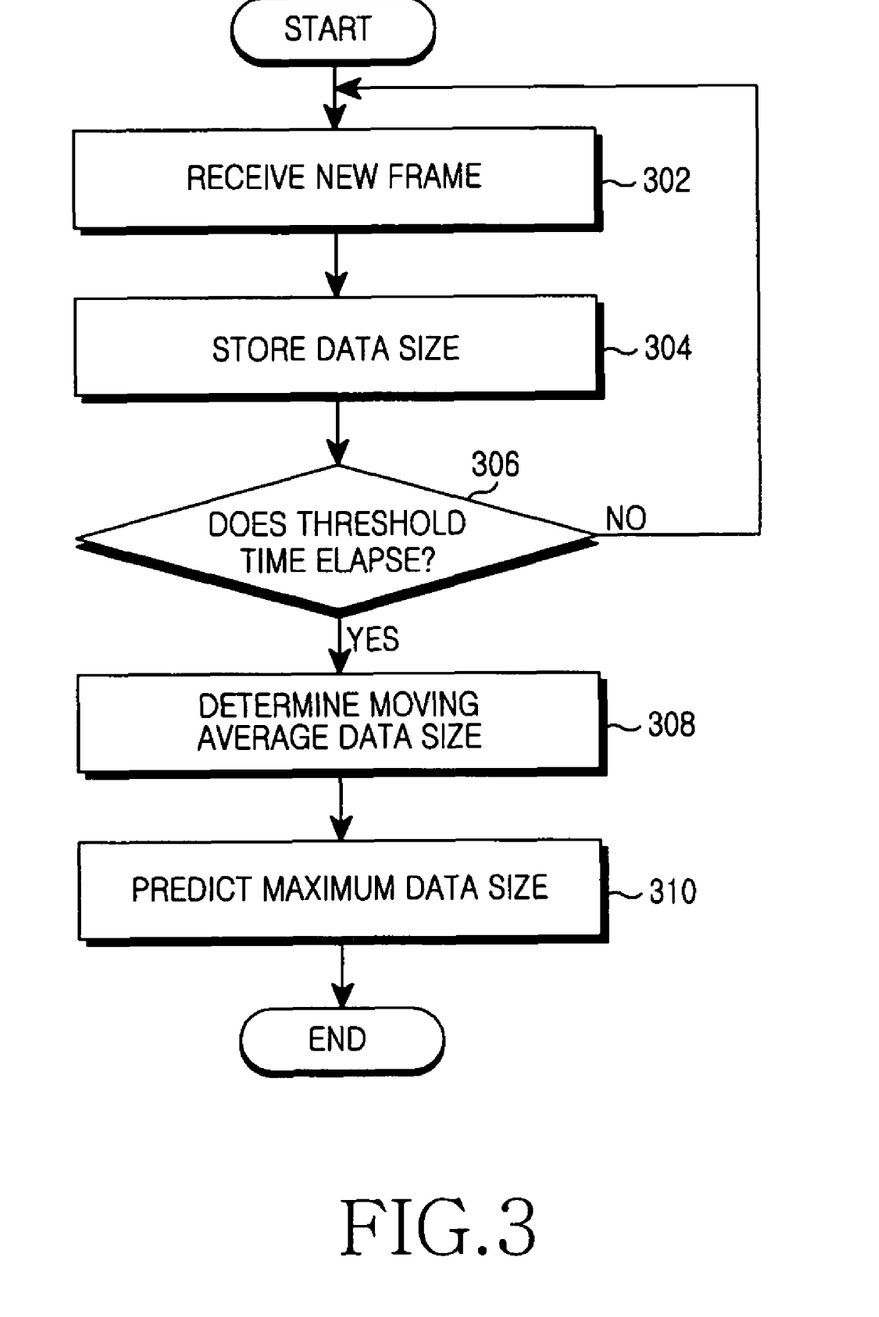
FIG. 3 illustrates a flowchart for a process of predicting a data size by using a moving average data size according to an exemplary embodiment of the present invention.

FIG. 3 illustrates a flowchart for a process of predicting a data size by using a moving average data size according to an exemplary embodiment of the present invention.

Referring to FIG. 3, when HARQ data is received in a new frame (step 302), a receiver stores a size of the HARQ data (step 304). The receiver determines whether a predetermined threshold time elapses in order to determine a specific observation time duration (step 306). If the threshold time does not elapse, the receiver stores the HARQ data size whenever the HARQ data is received. Otherwise, if the threshold time elapses, the receiver determines a moving average data size during the threshold time duration (step 308). By using the determined moving average data size, the receiver can predict a maximum HARQ data size (step 310).

The maximum data size can also be predicted by considering both an average CINR and an average data allocation size. That is, according to another embodiment, the procedure of FIG. 2 can be modified as follows. In step 204, the receiver stores a CINR measurement value together with a data size. In step 208, the receiver determines a moving average CINR and a moving average data size. In step 210, the receiver predicts a data size by referring a mapping table according to the average CINR. In step 212, the receiver compares the prediction result with the determined moving average data size, and determines a final maximum data size by selecting a greater data size.

According to still another embodiment, a data size required for a service can be determined. A receiving end may determine a data size according to a type of a service currently in use. A maximum data size varies depending on a service type, such as a video service, an audio service, and the like. The data size required for the service may be determined by software of the receiving end. The data size can also be determined by combining the aforementioned methods of predicting a data size. In doing so, it is possible to reduce capability deterioration when an LLR bit is compressed according to a data size predicted unnecessary larger than an actually required value. Therefore, a further improved prediction result can be obtained by combining the aforementioned methods.

Figure 4:
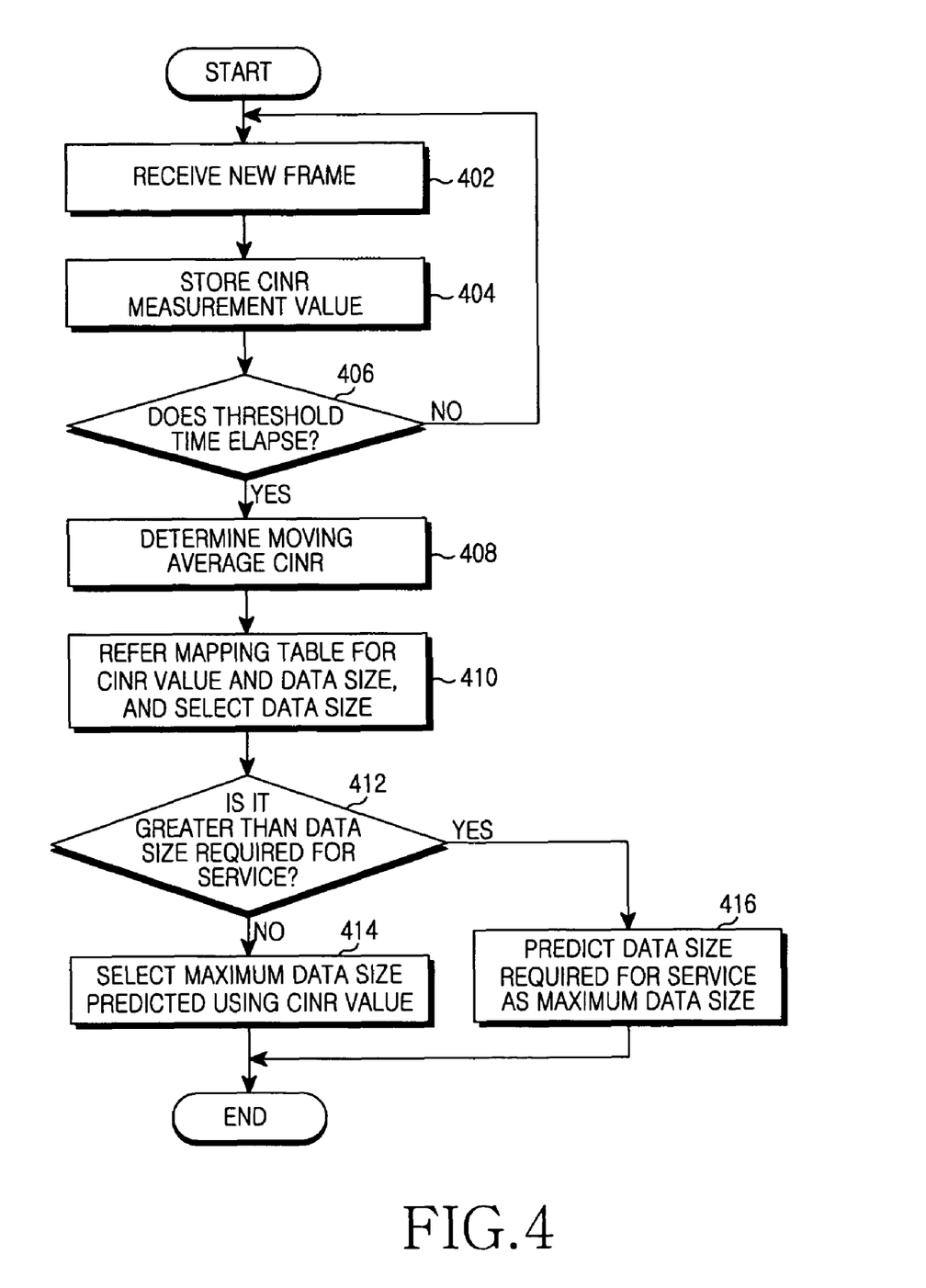
FIG. 4 illustrates a flowchart for a process of predicting an HARQ data size according to an exemplary embodiment of the present invention.

FIG. 4 illustrates a flowchart for a process of predicting an HARQ data size according to an exemplary embodiment of the present invention. In the process of FIG. 4, an average CINR value and a data size required for a service to be received are considered together.

Referring to FIG. 4, when a new frame is received (step 402), a receiver stores a CINR measurement value (step 404). The receiver determines whether a predetermined threshold time elapses in order to determine a specific observation time duration (step 406). If the threshold time does not elapse, the receiver stores each of CINR measurement values with a predetermined period. If the threshold time elapses, the receiver determines a moving average CINR during the threshold time duration (step 408). By using the determined moving average CINR value, the receiver refers a predetermined mapping table which shows a relation between a CINR value and a data size, and selects a maximum data size (step 410). Further, the receiver compares a maximum data size selected using the CINR value with a data size required for the service (step 412). If the selected maximum data size is greater than the data size required by the service, the receiver selects the data size required for the service as the maximum data size (step 416). That is, a predicted value greater than the data size required for the service is excluded since it is determined to be unnecessary. If the selected maximum data size is less than the data size required for the service, the receiver selects the maximum data size predicted using the CINR value (step 414).

Next, a method of regulating a length (i.e., the number of bits) of an LLR value of HARQ data will be described. If a maximum receivable data size is predicted at a current communication condition, a receiver determines the length (i.e., the number of bits) of the LLR value that can be stored in a memory according to the predicted value. If receivable data has a size that can be stored in the memory without compression, the receiver stores the LLR value having a length of n bits directly in the memory without compression. This is a case where the receiver has a low CINR value (i.e., when located in a cell edge) or a service requires a low data rate. In addition, as describe above, if a memory has a sufficient storage space, compressed LLR information can be stored together with uncompressed information. In this case, as shown in FIG. 5, only N-bit LLR values can be stored without data compression. However, when next received data having another ACID has a large size, there may be insufficient space for storing the data having another ACID. Therefore, LLR values having an original N-bit length and LLR values having a compressed M-bit length are separately stored in the memory. When a large memory size is required due to a great size of the next transmitted data having another ACID, a memory space where LLR values having the original N-bit length are stored is an over-writable space (see FIG. 5). The LLR values having a compressed M-bit length are maintained without change until HARQ ACK is generated or until HARQ data of corresponding ACID is initialized.

If the maximum receivable data size is too large to be stored in the memory without compression of LLR information, the receiver has to compress the LLR information to be stored in the memory. A ratio at which the LLR value is compressed can be determined according to an allocated data size, and thus a length (i.e., the number of bits) of the LLR value stored in the memory is not N bits but M bits. This is a case where an average CINR value measured in a receiving end is high or a data rate required for a service is high.

Figure 6:
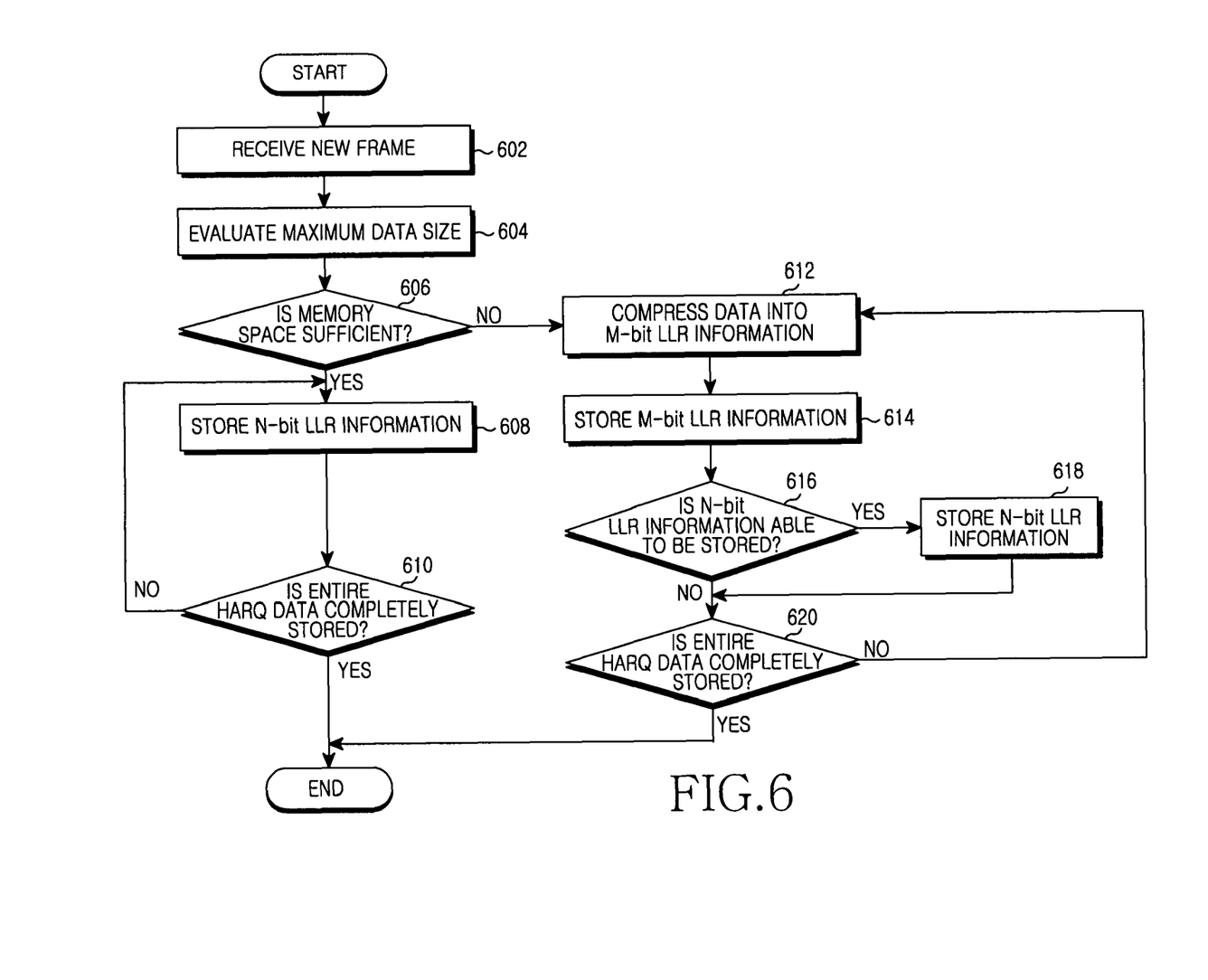
FIG. 6 illustrates a flowchart for a process of storing HARQ data in a memory by a receiver according to an exemplary embodiment of the present invention.

FIG. 6 illustrates a flowchart for a process of storing HARQ data in a memory by a receiver according to an exemplary embodiment of the present invention.

Referring to FIG. 6, when HARQ data is received in a new frame (step 602), the receiver evaluates a maximum data size predicted by the process of FIG. 2, FIG. 3, or FIG. 4 (step 604). Further, the receiver determines whether a memory space is large enough to store the evaluated maximum data size (step 606). In this case, the maximum data size may be multiplied by a length (i.e., the number of bits) of an LLR value to determine a necessary memory space, and the necessary memory space may be compared with a current memory space.

If the memory space is sufficient, the receiver stores HARQ data (i.e., LLR information) consisting of LLR values having a length of N bits in the memory (step 608). This operation is repeated until entire allocated HARQ data is completely stored (step 610). If an allocated memory space is insufficient, it is determined that M-bit compression is necessary. Thus, the receiver compresses the HARQ data consisting of the N-bit LLR values into M-bit LLR values (step 612), and stores the compressed M-bit LLR values in the memory (step 614).

The receiver evaluates each HARQ data size to detect a memory space capable of additionally storing uncompressed data (step 616). If the memory space is sufficient, uncompressed LLR information (herein, each LLR value has a length of N bits) and compressed LLR information (herein, each LLR value has a length of M bits) are both stored in the memory (step 618). Otherwise, if the memory space is insufficient, only M-bit LLR values are stored. Further, the receiver determines whether the entire HARQ data is completely stored in the memory (step 620). If the entire HARQ data is completely stored in the memory, the procedure of FIG. 6 ends, and otherwise, the procedure returns to step 612 to store next HARQ data. Steps 612 to 620 may be repeated until the entire HARQ data is completely stored.

Next, a method of managing an HARQ data memory will be described. When HARQ data is received, an empty space and a data storage area have to be allocated in the memory. When the HARQ data is retransmitted, location information of previously stored data is necessary, and presence or absence of uncompressed LLR information (herein, each LLR value hash a length of N bits) needs to be determined. The HARQ data can be intrinsically identified with a specific block size. In a general communication standard, a minimum transmission unit of HARQ data can be determined. The minimum transmission unit can be expressed with one bit. Therefore, when the HARQ data memory is divided into blocks of the minimum transmission unit and then is mapped to a bitmap, the entire HARQ memory area can be managed with a small data size. In one embodiment, bitmap information required for management of the HARQ memory may include bitmap information for storing N-bit (uncompressed) LLR information for each ACID, bitmap information for storing M-bit (compressed) LLR information for each ACID, and bitmap information for storing data of the entire HARQ data memory. By utilizing the above 3 types of information, all pieces of information required for memory space allocation and data location evaluation can be obtained.

Now, a method of reading HARQ data stored in an HARQ data memory will be described. When the HARQ data is retransmitted, the stored HARQ data is read according to two conditions as follows. If N-bit LLR information (herein, each LLR value has a length of N bits) is stored, the N-bit LLR information is read and combined with retransmitted N-bit LLR information. If only M-bit LLR information is stored, the M-bit LLR information is read and recovered into original N-bit LLR information, and then the recovered LLR information is combined with retransmitted N-bit LLR information.

Figure 7:
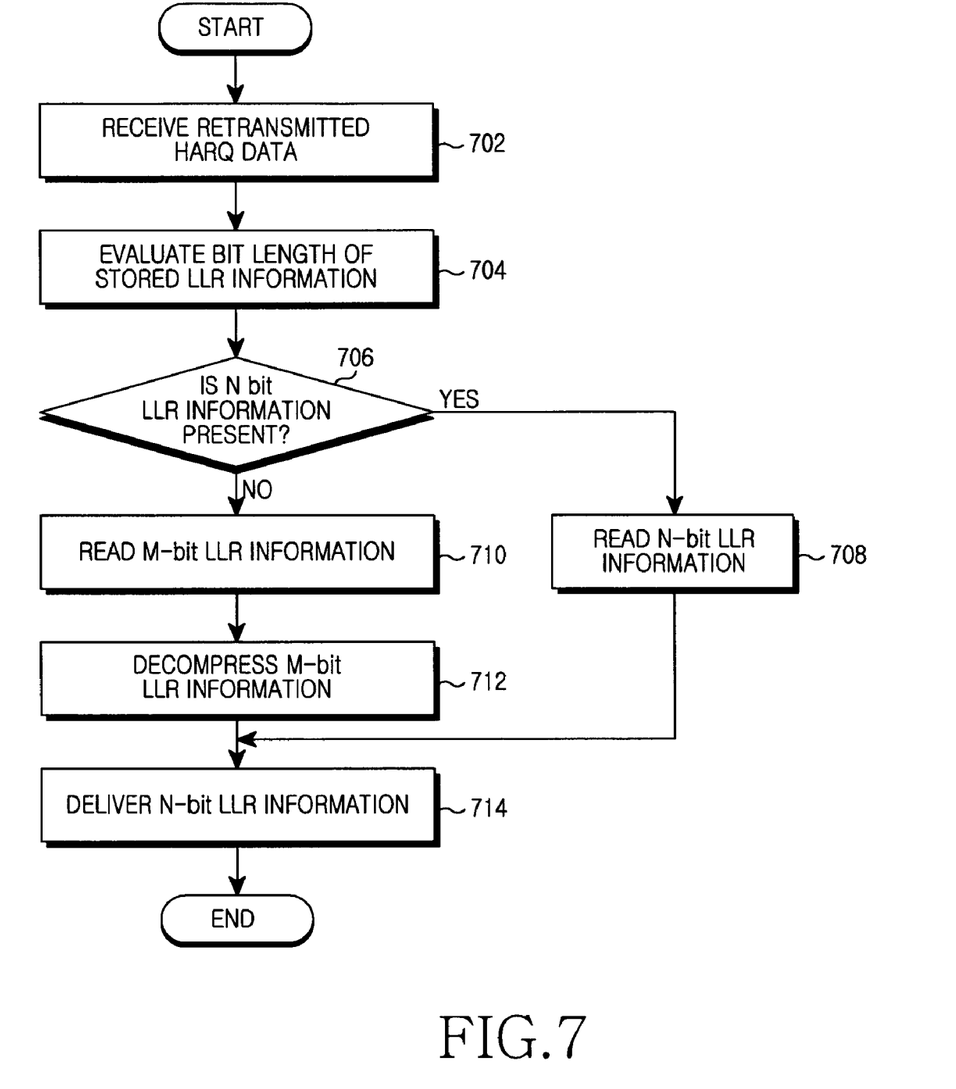
FIG. 7 illustrates a flowchart for a process of reading HARQ data stored in a memory according to an exemplary embodiment of the present invention.

FIG. 7 illustrates a flowchart for a process of reading HARQ data stored in a memory according to an exemplary embodiment of the present invention.

Referring to FIG. 7, when retransmitted HARQ data is received (step 702), a receiver evaluates the number of bits of an LLR value stored in the HARQ data memory (step 704), and determines presence or absence of uncompressed N-bit LLR information (herein, each LLR value has a length of N bits) (step 706). In the presence of the N-bit LLR information, the receiver reads the stored N-bit LLR information (step 708), and delivers the read N-bit LLR information to an HARQ combiner so that the N-bit LLR information can be combined with the retransmitted HARQ data (step 714). In the absence of the N-bit LLR information, the receiver reads stored compressed M-bit LLR information (herein, each LLR value has a length of M bits) (step 710), decompresses the read M-bit LLR information (step 712), and then delivers the decompressed M-bit LLR information to the HARQ combiner so that the M-bit LLR information can be combined with the retransmitted HARQ data (step 714).

According to exemplary embodiments of the present invention, when LLR information of HARQ data is stored, the number of bits of the LLR information is stored with or without compression, thereby effectively using a memory. Further, when the LLR information of the HARQ data is recombined, the LLR information is directly read according to the number of bits of previously stored LLR information or is read by performing decompression. Thus, a limited-sized HARQ memory can be effectively used, and HARQ combining capability close to optimal capability can be obtained. Furthermore, since a memory size required for obtaining optimal capability can be minimized, overall power consumption of a receiving end can be decreased and a size of a receiving apparatus can also be decreased.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A receiving apparatus for combining Hybrid Automatic Repeat Request (HARQ) data in a communication system, the apparatus comprising:
   a Log Likelihood Ratio (LLR) demapper configured to convert HARQ data received from a transmitting end into LLR information;
   a HARQ combiner configured to at least one of: (i) allow the LLR information of the received HARQ data to be stored, and (ii) combine corresponding LLR information stored in a HARQ data memory with the LLR information of the received HARQ data;
   a HARQ LLR information bit size controller configured to determine whether LLR information needs to be compressed according to a predicted maximum data size if the received HARQ data is not retransmitted data, and to store the LLR information converted according to the determination of whether compression is necessary; and
   the HARQ data memory configured to store the converted LLR information according to the determination of whether compression is necessary.

2. The receiving apparatus of claim 1, wherein, if the received HARQ data is retransmitted data, the HARQ LLR information bit size controller determines whether the LLR information stored in the HARQ data memory is compressed.

3. The receiving apparatus of claim 2, wherein if the LLR information is compressed, the HARQ LLR information bit size controller decompresses the LLR information and delivers the decompressed LLR information to the HARQ combiner.

4. The receiving apparatus of claim 1, further comprising a HARQ retransmission determination unit configured to determine whether the received HARQ data is retransmitted data by using a received allocation message.

5. The receiving apparatus of claim 1, further comprising a data size predictor configured to predict the maximum data size by considering at least one of a moving average Carrier to Interference and Noise Ratio (CINR) measured with a specific period, a moving average data size, and a data size required for a service.

6. The receiving apparatus of claim 1, wherein the HARQ LLR information bit size controller provides control such that, if the predicted maximum data size is less than an available space of the HARQ data memory, the LLR information of the HARQ data is stored without compression, and if the predicted maximum data size is greater than the available space of the HARQ data memory, the LLR information of the HARQ data is stored with compression by using an LLR information bit compressor.

7. The receiving apparatus of claim 1, wherein the HARQ LLR information bit size controller provides control such that, if the predicted data size is less than an available space of the HARQ data memory, the LLR information of the HARQ data is stored without compression, and at the same time, the LLR information is also stored with compression in the HARQ data memory.

8. A receiving method for combining Hybrid Automatic Repeat Request (HARQ) data in a communication system, the method comprising:
   predicting a maximum size of currently receivable data;
   converting HARQ data received from a transmitting end into Log Likelihood Ratio (LLR) information;
   determining whether the received HARQ data is retransmitted data; and
   storing the converted LLR information in a memory according to the determination of whether compression is necessary.

9. The receiving method of claim 8, further comprising:
   if the determination indicates that the HARQ data is not the retransmitted data, determining whether the converted LLR information is compressed according to the predicted maximum data size.

10. The receiving method of claim 8, further comprising:
    if the received HARQ data is the retransmitted data, determining whether the LLR information currently stored in the memory is compressed;
    if uncompressed LLR information exists in the memory, reading the uncompressed LLR information from the memory, and if only compressed LLR information exists in the memory, decompressing and reading the compressed LLR information; and
    combining the LLR information of the received HARQ data with the read LLR information.

11. The receiving method of claim 8, wherein the maximum data size is predicted by considering at least one of a moving average Carrier to Interference and Noise Ratio (CINR) measured with a specific period, a moving average data size, and a data size required for a service.

12. The receiving method of claim 9, wherein the determining of whether the converted LLR information is compressed comprises:
    if the predicted data size is less than an available storage space, providing control such that the LLR information of the HARQ data is directly stored without compression; and if the predicted data size is greater than the available storage space, providing control such that the LLR information of the HARQ data is stored with compression.

13. The receiving method of claim 12, further comprising, if the predicted data size is less than an available storage space, providing control such that the LLR information of the HARQ data is directly stored without compression, and at the same time, the LLR information of the HARQ data is also stored with compression in the memory.

14. A device for use in a wireless communication network, the device comprising:
   a receiver configured to combine Hybrid Automatic Repeat Request (HARQ) data in a communication system, the receiver comprising:
      a Log Likelihood Ratio (LLR) demapper configured to convert HARQ data received from a transmitting end into LLR information;
      a HARQ combiner configured to at least one of: (i) allow the LLR information of the received HARQ data to be stored, and (ii) combine corresponding LLR information stored in a HARQ data memory with the LLR information of the received HARQ data;
      a HARQ LLR information bit size controller configured to determine whether LLR information needs to be compressed according to a predicted maximum data size if the received HARQ data is not retransmitted data, and to store the LLR information converted according to the determination of whether compression is necessary; and
      the HARQ data memory configured to store the converted LLR information according to the determination of whether compression is necessary.

15. The device of claim 14, wherein, if the received HARQ data is retransmitted data, the HARQ LLR information bit size controller determines whether the LLR information stored in the HARQ data memory is compressed.

16. The device of claim 15, wherein if the LLR information is compressed, the HARQ LLR information bit size controller decompresses the LLR information and delivers the decompressed LLR information to the HARQ combiner.

17. The device of claim 14, further comprising a HARQ retransmission determination unit configured to determine whether the received HARQ data is retransmitted data by using a received allocation message.

18. The device of claim 14, further comprising a data size predictor configured to predict the maximum data size by considering at least one of a moving average Carrier to Interference and Noise Ratio (CINR) measured with a specific period, a moving average data size, and a data size required for a service.

19. The device of claim 14, wherein the HARQ LLR information bit size controller provides control such that, if the predicted maximum data size is less than an available space of the HARQ data memory, the LLR information of the HARQ data is stored without compression, and if the predicted maximum data size is greater than the available space of the HARQ data memory, the LLR information of the HARQ data is stored with compression by using an LLR information bit compressor.

20. The device of claim 14, wherein the HARQ LLR information bit size controller provides control such that, if the predicted data size is less than an available space of the HARQ data memory, the LLR information of the HARQ data is stored without compression, and at the same time, the LLR information is also stored with compression in the HARQ data memory.

* * * * *